United States Patent [19]

Anthony et al.

[11] Patent Number: 4,970,986
[45] Date of Patent: Nov. 20, 1990

[54] APPARATUS FOR SYNTHETIC DIAMOND DEPOSITION INCLUDING SPRING-TENSIONED FILAMENTS

[75] Inventors: Thomas R. Anthony; Richard A. Engler; Robert H. Ettinger, all of Schenectady; James F. Fleischer, Scotia; Robert C. DeVries, Burnt Hills, all of N.Y.

[73] Assignee: General Electric Company, Schenectady, N.Y.

[21] Appl. No.: 469,986

[22] Filed: Jan. 25, 1990

Related U.S. Application Data

[63] Continuation-in-part of Ser. No. 389,210, Aug. 3, 1989, abandoned.

[51] Int. Cl.⁵ .......................................... C23C 16/46
[52] U.S. Cl. ................................. 118/724; 118/725; 118/728; 156/DIG. 68; 423/446
[58] Field of Search ................. 118/724, 725, 728; 156/DIG. 68; 423/446; 427/50

[56] References Cited

U.S. PATENT DOCUMENTS 4,306,515 12/1981 Winkler ............................ 118/724
4,481,232 11/1984 Olson ............................... 118/725

OTHER PUBLICATIONS

Chemical & Engineering News, vol. 67, No. 20 (May 15, 1989), pp. 24–39.

Primary Examiner—Richard Bueker
Attorney, Agent, or Firm—William H. Pittman; James C. Davis, Jr.

[57] ABSTRACT

Diamond is deposited by chemical vapor deposition on two parallel substrates, by means of a plurality of filaments between said substrates. The substrates and filaments are in vertical configuration and the filaments are linear and spring-tensioned to compensate for thermal expansion and expansion caused by filament carburization. The apparatus includes at least one and preferably two temperature controlling means, usually heat sinks, to maintain substrate temperature in the range of 900°–1000° C., for optimum rate of diamond deposition.

13 Claims, 4 Drawing Sheets

APPARATUS FOR SYNTHETIC DIAMOND DEPOSITION INCLUDING SPRING-TENSIONED FILAMENTS

This application is a continuation-in-part of copending application Ser. No. 07/389,210 filed Aug. 3, 1989, now abandoned.

This invention relates to the c vapor deposition of diamond, and more particularly to an apparatus for use in such deposition.

Various methods are known for the synthetic production of diamond. In particular, the deposition of diamond coatings on substrates to produce cutting and abrasive tools is known.

One class of methods developed in recent years for synthetic diamond deposition consists of the chemical vapor deposition (hereinafter sometimes "CVD") methods. For a general summary of various diamond deposition methods including CVD methods, reference is made to *Chemical & Engineering News*, 67 (20), 24–39 (May 15, 1989), incorporated herein by reference.

In the CVD methods, a mixture of hydrogen and a hydrocarbon gas such as methane is thermally activated and passed into contact with a substrate. The hydrogen gas is converted to atomic hydrogen which reacts with the hydrocarbon to form elemental carbon, which deposits on the substrate in the form of diamond. Many of the CVD diamond coating methods, hereinafter referred to as "filament" methods, employ one or more resistance heating units including heated wires or filaments, typically at temperatures of at least 2000° C., to provide the high activation temperatures at which these conversions take place.

Various problems have been encountered in filament methods of CVD diamond deposition, and they have inhibited to a considerable extent the usefulness thereof on a commercial scale. For example, it is difficult to create conditions under which the deposition rate of diamond is high enough to be commercially feasible. Numerous methods employing a horizontal configuration of the substrate(s) and filaments, with helically wound filaments, have been disclosed, but for the most part the deposition rate afforded thereby is low.

Also, numerous problems with the filaments have been observed. Substantial expansion thereof occurs at the aforementioned high temperatures; this is, in part, thermal expansion but to a greater extent, in the case of the tungsten filaments frequently employed, is the result of carburization, forming tungsten carbide with concomitant expansion to the extent of about 20%. If such expansion is uncontrolled, filament breakage and/or contact between the filaments and substrate can occur, either of which will terminate diamond deposition.

The damage resulting from carburization is particularly severe when a helical filament configuration is employed. Carburization is accompanied by cracking of the tungsten carbide, often in a spiral configuration which can cause deformation of a helically wound filament in unpredictable directions. The deposition operation is thus usually prematurely aborted, much short of the 30–40 day period normally required for the deposition of a diamond film of 0.5–1.0 mm. in thickness.

It is further often found that the substrate temperature is incompatible with a high rate of diamond deposition. In certain instances, the filament temperatures which produce atomic hydrogen in the necessary proportions cause the substrate to reach a temperature higher than about 1000° C. In other instances, substrate temperatures may be below 900° C. Optimum substrate temperatures for diamond deposition are in the range of 900°–1000° C.

The present invention is based on several discoveries of conditions which promote optimum diamond deposition on substrates. In the first place, it has been found that nucleation and growth of diamond is maximized when the reactor configuration includes two substantially parallel substrates on opposite sides of a plurality of filaments, rather than substrates horizontally configured, or vertically in a square or cylindrical array or one substrate between banks of filaments. In the second place, long filament life is attained with linear filaments which are spring-tensioned to compensate for thermal expansion and expansion caused by carburization. In the third place, employment of controlling means for substrate temperature permits control of the deposition reaction which may optimize diamond growth rates.

The invention provides an apparatus for improved production of CVD diamond coatings by the filament method. The features of the invention permit closer control of filament configuration than has previously been possible, as well as control of substrate temperature for maximization of deposition rate. One result is an increase in filament life, which enables the deposition process to be continued until a coating of substantial thickness is produced.

Accordingly, the invention is directed to apparatus for deposition of diamond on substrates by chemical vapor deposition, comprising:

a closed reaction chamber having at least one gas inlet and at least one exhaust means, said chamber being capable of being maintained at a pressure below atmospheric;

support means for supporting said substrates in said chamber parallel to each other and spaced apart to permit gas flow between said substrates;

resistance heating means comprising a plurality of vertically extending linear, electrically conductive filaments situated substantially equidistant from said substrates, each of said filaments being secured at one end to a fixed electrode and at the other to a moveable electrode for supplying power to said filaments and thereby heating them; and a plurality of spring means attached to said moveable electrodes, for holding said filaments taut and substantially parallel to said substrates without causing breakage of said filaments.

The invention will be described in detail with reference to the drawings, in which.

Figure 1:
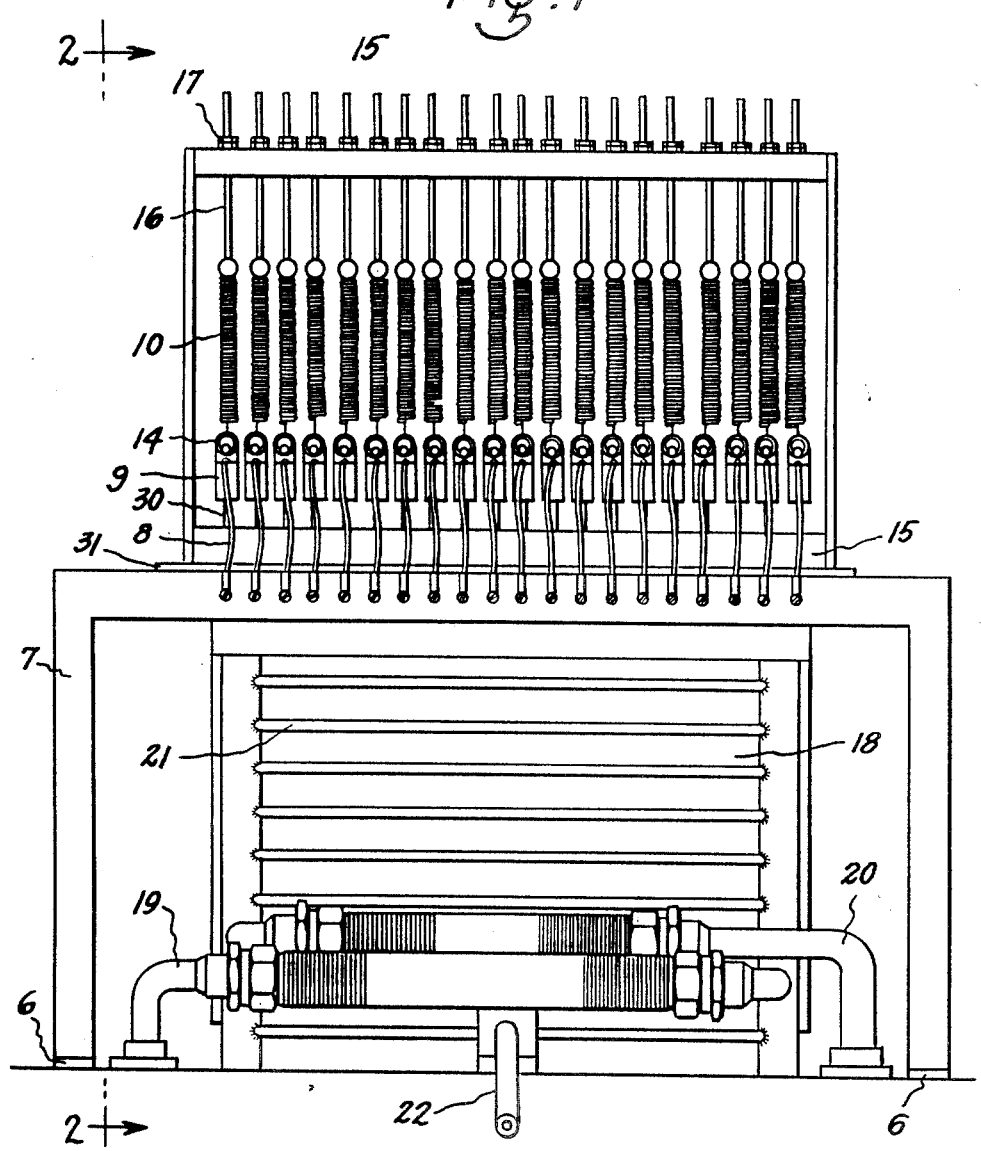
FIG. 1 is a schematic side view of an illustrative apparatus according to the present invention.
Figure 2:
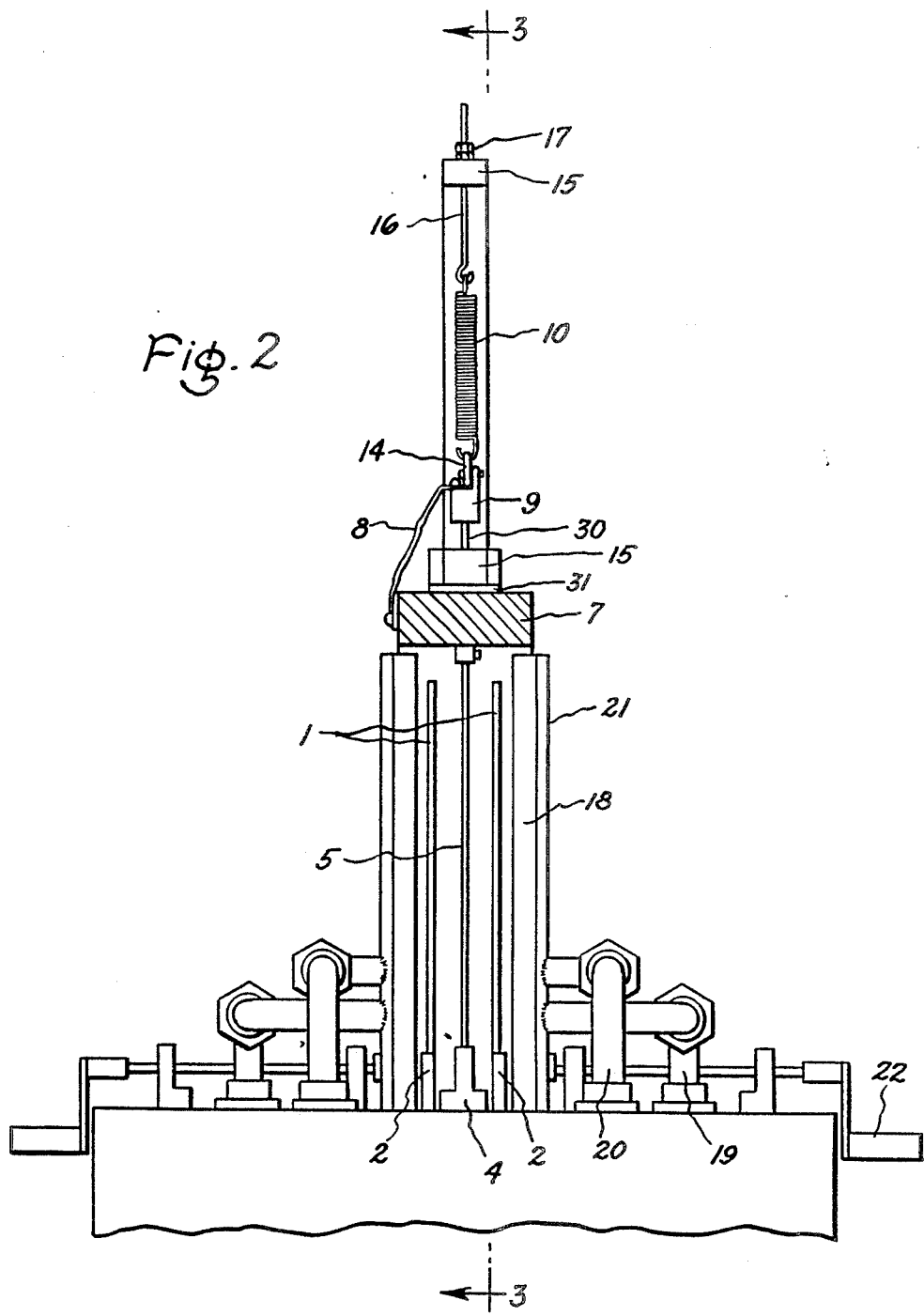
FIG. 2 is a cutaway view of said apparatus on the line 2—2 of FIG. 1.
Figure 3:
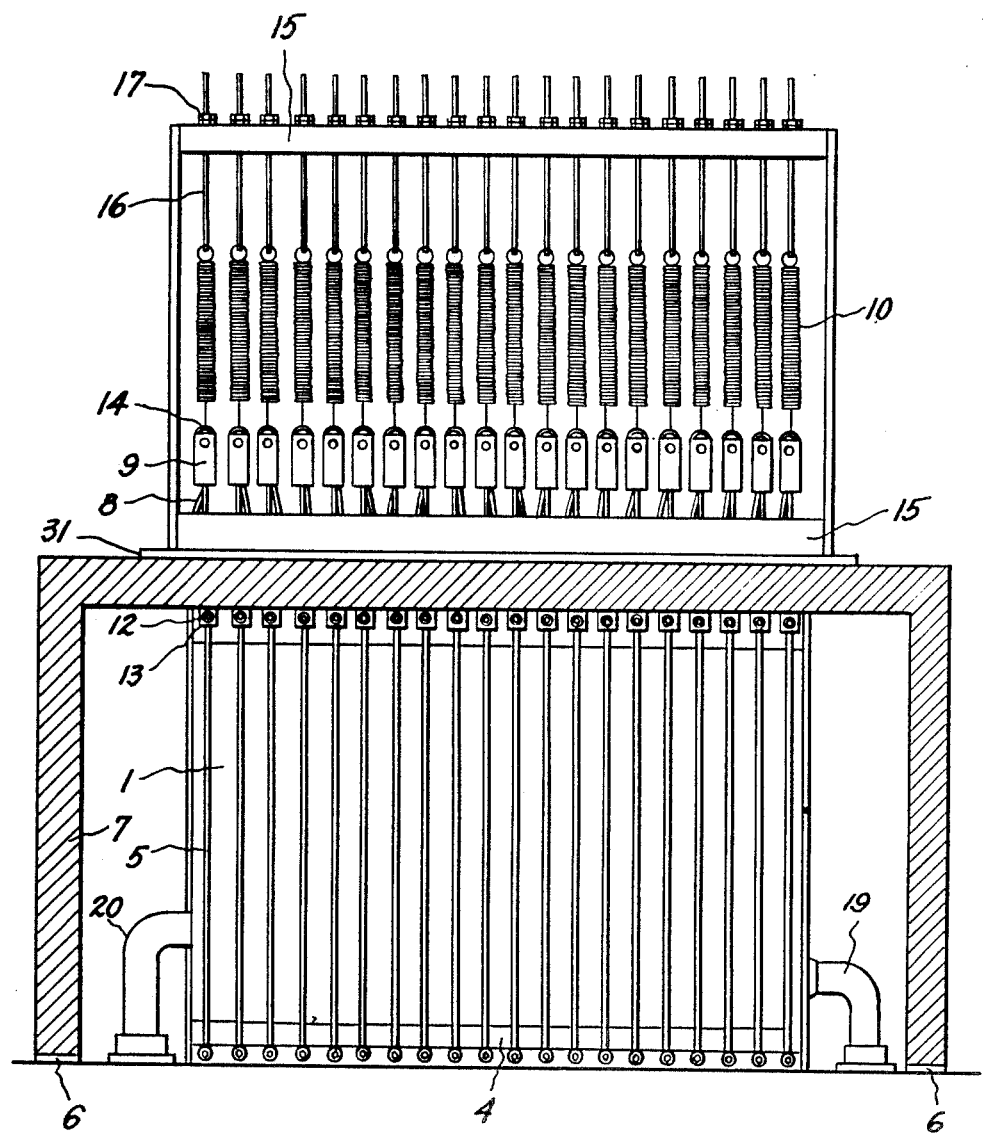
FIG. 3 is a further cutaway view on the line 3—3 of FIG. 2.

Referring now to the drawings, there are depicted the interior features of a CVD diamond deposition unit according to the present invention. All of said features are enclosed in a reaction chamber (not shown) which is air-tight and thus capable of being maintained at reduced pressure and is fitted with a suitable gas inlet and an exhaust port. All portions of the apparatus which are present in the reaction chamber are constructed of suitable heat-resistant materials, as necessary to withstand filament temperatures on the order of about 2000° C. and substrate temperatures up to about 1000° C. Quartz is an illustrative non-conductive heat-resistant material suitable for this purpose.

The features of the apparatus and associated articles which are shown in the drawings include a pair of substrates 1, which are normally planar although they may be gently curved. Any substrate material suitable for diamond deposition thereon may be employed; examples of such materials are boron, boron nitride, platinum, graphite, molybdenum, copper, aluminum nitride, silver, iron, nickel, silicon, alumina and silica, as well as combinations thereof. Metallic molybdenum substrates are particularly suitable under many conditions and are often preferred. Supports 2 serve as support means for holding substrates 1 in position parallel to each other and at a suitable spacing for deposition to take place.

The apparatus also contains resistance heating means comprising two electrodes and a number of vertically extending linear, electrically conductive filaments or wires (hereinafter generically designated "filaments"), and otherwise being of conventional design and circuitry. The material of which said filaments are comprised is not critical, any material known in the art as suitable for this purpose being acceptable. Illustrative materials are metallic tungsten, tantalum, molybdenum and rhenium; because of its relatively low cost and particular suitability, tungsten is often preferred. Filament diameters of about 0.2–1.0 mm. are typical, with about 0.8 mm. frequently being preferred.

The filaments are located between said substrates, parallel to and substantially equidistant therefrom. Distances from filaments to substrates are generally on the order of 5–10 mm.

In the drawings, fixed electrode 4 is grounded and is fixedly attached to a number of said filaments, one of which is designated 5. Since a plurality of filaments and associated structure are present, reference thereto hereinafter and in the drawings will be to only one; it should be understood that the total number thereof is not critical to the invention.

Insulator 6 separates the fixed electrode and its base from conducting element 7. The latter is conductively connected via conductor 8, typically of copper braid, to moveable electrode 9.

Figure 4:
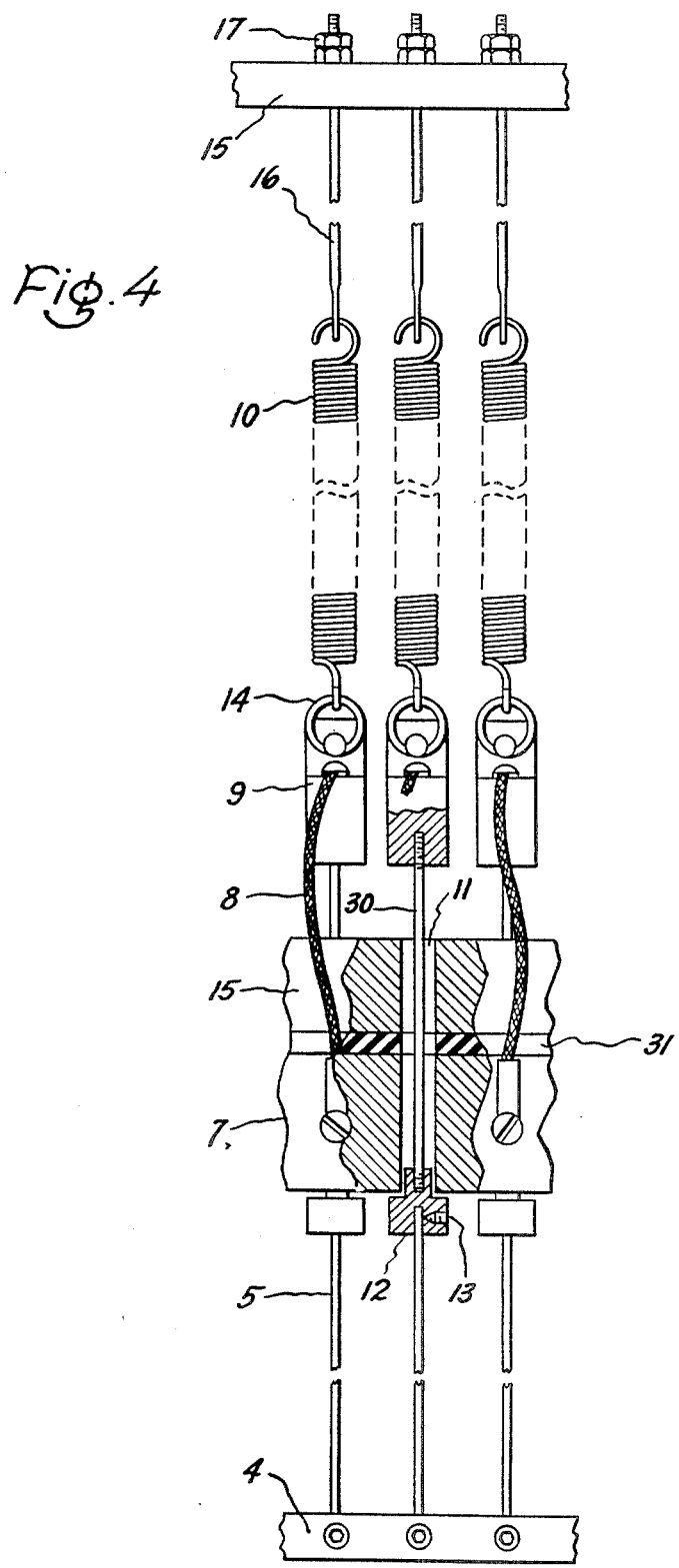
FIG. 4 is a detail view of certain aspects of the filament tensioning mechanism which forms part of the invention.

Said moveable electrode is shown as connected to filament 5 via a bearing. The bearing construction depicted in the drawings, and especially in FIG. 4, includes rod 30 fixedly attached to moveable electrode 9 and passing through holes 11 in the bottom portion of support frame 15 and in conducting element 7; and plug 12 fixedly fastened to rod 30 by set screw 13, said plug 12 having sufficient clearance from conducting element 7 to permit filament 5 to be maintained taut as described hereinafter, but insufficient to permit overtensioning thereof, which could cause breakage of the filament.

Filament 5 is held taut and substantially parallel to substrates 1 by spring 10, fixedly fastened to support frame 15 by rod 16 and fastening nuts 17. Although the spring is depicted as being an extension coil spring providing tension in the stretching mode, it will be apparent to one skilled in the art that similar results could be obtained employing other types of springs. For example, compression coil springs operating in he compressive mode or cantilevered flat or coil springs operating in the bending mode could be used.

It is within the scope of the invention for springs 10 to comprise an insulating material or one with conductive properties so different from those of the resistance heating means that no appreciable conduction of current through said springs occurs. Most often, however, it will be desired to make said springs from readily available metal such as steel. It may then be necessary to electrically isolate spring 10 and frame 15 from the resistance heating means, in order to avoid overheating thereof.

Accordingly, the attachment shown between spring 10 and moveable electrode 9 is achieved via insulating ring 14, comprising a suitable non-conductive material such as quartz or high temperature-resistant plastic. Likewise, insulator 31, typically of temperature-resistant plastic such as polytetrafluoroethylene, is located between conductor 7 and frame 15.

It is highly desirable to maintain substrates 1 at temperatures in the range of about 900°–1000° C., since within this range minimum reaction occurs between the hydrogen present in the gas mixture and the elemental carbon formed from the hydrocarbon therein; thus, said elemental carbon remains available to deposit as diamond at a high growth rate on the substrate. Absent any provisions for independently controlling substrate temperature, said temperature frequently exceeds or falls short of 1000° C. and the diamond growth rate decreases substantially.

According to an optional feature of the invention, the desired temperature control is achieved by substrate temperature controlling means situated adjacent one and preferably both of said substrates on the opposite side(s) from said filaments. These are shown in the drawings as cooling means comprising at least one and preferably two heat sinks 18. Each heat sink is typically made of metallic copper and cooled by attached serpentine tubing 21 (also usually of copper) fitted with cooling water inlet and outlet 19 and 20, respectively. The distance of heat sink 18 from substrate 1 is adjusted by a conventional screw mechanism controlled by crank 22, and said distance and the flow rate of water through the tubing are adjusted, either manually or automatically via suitable sensors, to maintain the substrate within the desired temperature range.

Those skilled in the art will recognize that heat sinks 18 may be replaced by conventional heating means when appropriate.

In operation, the reaction chamber of the apparatus of this invention is maintained at a pressure up to about 760 torr, typically on the order of 10 torr. A mixture of hydrogen and a hydrocarbon, most often methane and generally present in an amount up to about 2% by weight based on total gases, is passed into the chamber and a current is passed through the electrodes and filaments to heat the filaments to a temperature of at least about 2000° C. With the substrate configuration employed, gas diffusion between the substrates and in contact with the filaments promotes excellent nucleation and growth of diamond particles.

The temperature controlling means are maintained at a distance from the substrate and (in the case of heat sinks) water passage through the tubing associated therewith is maintained at a rate to provide a substrate temperature in the range of about 900°–1000° C., most often about 950° C. At such temperatures, diamond growth rate approaches its highest value. Spring tension is maintained on the filaments as previously described, whereby they remain in substantially planar configuration even with the occurrence of thermal expansion and expansion due to carburization. Using this combination of elements, it is possible to grow diamond films with thicknesses up to about 1 mm., or even greater on occasion, within a time span of 30-40 days without filament breakage or other untoward events occurring.

What is claimed is:

1. Apparatus for deposition of diamond on substrates by chemical vapor deposition, comprising:
    a closed reaction chamber having at least one gas inlet and at least one exhaust means, said chamber being capable of being maintained at a pressure below atmospheric;
    support means for supporting said substrates in said chamber parallel to each other and spaced apart to permit gas flow between said substrates;
    resistance heating means comprising a plurality of vertically extending linear, electrically conductive filaments situated substantially equidistant from said substrates, each of said filaments being secured at one end to a fixed electrode and at the other to a moveable electrode for supplying power to said filaments and thereby heating them; and
    a plurality of spring means attached to said moveable electrodes, for holding said filaments taut and substantially parallel to said substrates without causing breakage of said filaments.

2. Apparatus according to claim 1 further comprising means for electrically isolating said spring means from said filaments.

3. Apparatus according to claim 2 wherein said fixed electrode is located below the space between said substrates.

4. Apparatus according to claim 3 wherein the filaments comprise metallic tungsten.

5. Apparatus according to claim 3 wherein the spring means comprise extension coil springs.

6. Apparatus according to claim 3 wherein the spring means comprise compression coil springs.

7. Apparatus according to claim 3 wherein the spring means comprise cantilevered springs.

8. Apparatus according to claim 1 further comprising temperature controlling means situated adjacent one of said substrates on the opposite side from said filaments.

9. Apparatus according to claim 8 wherein the temperature controlling means are cooling means.

10. Apparatus according to claim 9 including a pair of substrate cooling means on the opposite side from said filaments of each of said substrates.

11. Apparatus according to claim 10 further comprising means for adjusting the distance from the substrates to the substrate cooling means.

12. Apparatus according to claim 11 wherein the cooling means comprise metallic copper with provision for passage of cooling water.

13. Apparatus for deposition of diamond on a pair of planar vertical substrates by chemical vapor deposition, comprising:
    a closed reaction chamber having at least one gas inlet and at least one exhaust means, said chamber being capable of being maintained at a pressure below atmospheric;
    support means for supporting said substrates in said chamber, parallel to each other and spaced apart to permit gas flow between said substrates;
    resistance heating means comprising a plurality of vertically extending linear tungsten filaments situated substantially equidistant from said substrates, each of said filaments being secured at the lower end to a fixed electrode and at the upper end to a moveable electrode for supplying power to said filaments and thereby heating them;
    a plurality of extension coil springs attached to said moveable electrodes, for holding said filaments taut and substantially parallel to said substrates without causing breakage of said filaments;
    means for electrically isolating said springs from said filaments; and
    a pair of moveable heat sinks situated adjacent said substrates on the opposite side from said filaments, said heat sinks comprising metallic copper with provision for passage of cooling water.

* * * * *